United States Patent
Shimizu

(10) Patent No.: US 8,933,402 B2
(45) Date of Patent: Jan. 13, 2015

(54) SAMPLE ANALYSIS APPARATUS AND SAMPLE ANALYSIS PROGRAM

(71) Applicant: HORIBA, Ltd., Kyoto-shi, Kyoto (JP)

(72) Inventor: Tomoya Shimizu, Kyoto (JP)

(73) Assignee: HORIBA, Ltd., Kyoto-shi (JP)

( * ) Notice: Subject to any disclaimer, the term of this patent is extended or adjusted under 35 U.S.C. 154(b) by 0 days.

(21) Appl. No.: 13/829,289

(22) Filed: Mar. 14, 2013

(65) Prior Publication Data

US 2013/0240729 A1  Sep. 19, 2013

(30) Foreign Application Priority Data

Mar. 16, 2012 (JP) .................................. 2012-061152
Feb. 7, 2013 (JP) .................................. 2013-022676

(51) Int. Cl.
*G01N 5/00* (2006.01)
*H01L 21/66* (2006.01)

(52) U.S. Cl.
CPC ................ *H01L 22/20* (2013.01); *H01L 22/12* (2013.01)
USPC ............ 250/310; 250/306; 250/307; 250/311

(58) Field of Classification Search
USPC .................. 250/306, 307, 310, 311
See application file for complete search history.

(56) References Cited

U.S. PATENT DOCUMENTS

| 8,249,828 | B2 * | 8/2012 | Teshima et al. | 702/183 |
| 2002/0145112 | A1 * | 10/2002 | Davidson | 250/307 |
| 2007/0023655 | A1 * | 2/2007 | Nishikata et al. | 250/310 |
| 2011/0251713 | A1 * | 10/2011 | Teshima et al. | 700/110 |

FOREIGN PATENT DOCUMENTS

JP       2010071874 A      2/2010

* cited by examiner

*Primary Examiner* — Michael Maskell
(74) *Attorney, Agent, or Firm* — Alleman Hall McCoy Russell & Tuttle LLP

(57) ABSTRACT

A sample is analyzed efficiently with combining a structural defect detection and a physical information measurement so as to determine whether a structural defect is the defect that degrades the device performance or not, not only by detecting the structural defect exists in the sample, but also by measuring a physical information that occurs due to the structural defect. It comprises a structural defect detection device 2 that detect a structural defect KK of a sample W, a structural defect setting device that sets up the structural defect KK for which a physical information is to be measured based on the defect information among the structural defect KK detected by the structural defect detection device 2, and a physical information measurement device 3 that measures the physical information of the defect region KR including the structural defect set up by the structural defect setting device.

11 Claims, 3 Drawing Sheets

SAMPLE ANALYSIS APPARATUS AND SAMPLE ANALYSIS PROGRAM

FIELD OF THE INVENTION

The present invention relates to a sample analysis apparatus and a sample analysis program to analyze, for example, a semiconductor wafer or an epitaxial wafer, etc.

BACKGROUND ART

Although using SiC wafers as bulk wafers for semiconductor devices such as power devices etc., has attracted attention in recent years, a characteristic of SiC wafers is that they are easily contaminated by impurities and defects such as a crystal defects, etc., often result.

For this reason, in order to improve the performance of semiconductor devices by making a SiC wafer that has high quality and low defect density, an epitaxial film is formed by carrying out epitaxial growth of a SiC single-crystal film on a surface of the SiC wafer, and the result used as an epitaxial wafer.

However, even if an epitaxial film is formed on the surface of a SiC wafer, for some kinds of defects in the SiC wafer, there is a problem that the epitaxial film might have no effect, and the performance of the semiconductor device might be degraded.

In addition to the case of forming the epitaxial film on the SiC wafer, the same problem also might happen in the case of forming the epitaxial film on other types of semiconductor substrates, such as a GaN substrate or a Si substrate.

Accordingly, it will be appreciated that by detecting the crystal defect of the SiC wafer, it may be determined whether the wafer is a suitable wafer on which to form the epitaxial film, and a yield rate may be improved. To that end, it is conceived in Patent Document 1 that by using a so-called cathode luminescence measurement apparatus, the crystal defect of the SiC wafer may be detected.

RELATED ART

Patent Document

Patent Document 1: Japanese Unexamined Patent Application Publication No. 2010-71874

SUMMARY OF THE INVENTION

Problems to be Solved by the Invention

However, the present inventor has discovered that there are defects that degrade device performance of the semiconductor device and defects that do not degrade device performance even though the crystal defect is detected using the cathode luminescence measurement apparatus, and it may be insufficient merely to perform defect inspection with the cathode luminescence apparatus.

Accordingly, it is a primary object of the present invention not only to detect that a structural defect of the crystal defect, etc., exists in a sample, but also to analyze efficiently the sample by combining structural defect detection and a measurement of a physical information so that it can be determined whether the structural defect is a defect that degrades the device performance or not by measuring the physical information that occurs due to the structural defect.

BRIEF SUMMARY OF THE INVENTION

To that end, a sample analysis apparatus according to the present invention comprises a structural defect detection device that detects the structural defect of a sample, a structural defect setting device that sets the structural defect for which the physical information is to be measured from among the structural defects detected by the structural defect detection device based on the defect information of the structural defect, and a physical information measurement device that measures physical information in a defect region including the structural defect that is set by the structural defect setting device. In addition, as the defect information, for example, a kind of the structural defect (a point defect, a line defect, a plane defect, etc.), a size of the structural defect, a shape of the structural defect, and a position of the structural defect in the sample, etc. may be considered. Moreover, the defect region including the structural defect may also be the structural defect itself.

With this configuration, the structural defect detection device not only detects the structural defect, but also the structural defect setting device sets the structural defect for which the physical information is to be measured based on the defect information of the structural defect device and the physical information measurement device measures the physical information of the defect region including the set structural defect, and therefore it is possible to determine whether the defect degrades the performance of an article of manufacture or not, which is difficult determine only from detecting the structural defect by the structural defect detection device. For example, it is possible to determine that a structural defect with a large stress concentration is a defect that degrades the performance of the article of manufacture and a structural defect with a small stress concentration is not a defect that degrades the performance of the article of manufacture. Thereby, it has the effect of improving the yield rate of the articles of manufacture. Moreover, although measuring the physical information by the physical information measurement device for the whole sample in the same way as the structural defect device is possible, this will take time to measure the physical information, and as a result sample analysis will be time consuming. According to the present invention, since the physical information of the defect region including the structural defect is measured locally, the time of sample analysis can be shortened.

As the structural defect, for example, the crystal defect can be considered, and the point defect, the line defect, and the plane defect, etc. can be considered as the crystal defect. Depending on the kind of such the structural defect or its size, the influences on the article of manufacture (an epitaxial film etc. in the case of the semiconductor wafer) are also different. For example, depending on the article of manufacture, some can disregard the influence of the point defect and others can disregard the influence of the point defect and the line defect. For this reason, in order to do the sample analysis corresponding to the use, etc. of the article of manufacture, it is desirable that the structural defect setting device sets up the structural defect for which the physical information is to be measured according to the kind or the size of the structural defect.

As an embodiment of the structural defect setting device, although it is possible to set up the structural defect for which the physical information is to be measured based on a setting condition signal that is set beforehand, in order to improve usability for the user, it is preferable that the structural defect setting device receives a structural defect designating signal that the user designates as the structural defect for which physical information is to be measured, based on the defect information of the structural defect, and sets the structural defect for which the physical information is to be measured based on the structural defect designating signal. With this configuration, since the user can set the structural defect that the user considers to include the physical information required to be measured from among the structural defects obtained by the structural defect setting device, the sample can be analyzed according to the user's analysis goals.

Moreover, the sample analysis apparatus according to the present invention comprises a structural defect detection device that detects a structural defect of the sample, and a physical information measurement device that measures the physical information of the region other than the defect region including the structural defect detected by the structural defect detection device.

With this configuration, since the structural defect detection device not only detects the structural defect, but also the physical information measurement device measures the physical information of the region other than the defect region including the structural defect, structural defects that are not detected by the structural defect detection device or other defects can be determined from the physical information measurement results of the physical information measurement device. For example, even where no structural defect appears but a stress concentration occurs for some reason, it can be determined that the performance of the article of manufacture is degraded by the stress concentration. As a result, the yield rate of the article of manufacture may be effectively improved. Moreover, since physical information measurement of a region other than the defect region including the detected defect is measured by the structural defect detection device, it is not necessary to do the physical information measurement of the whole sample, and the time of sample analysis can be shortened.

A sample analysis program preferably employed by the sample measurement apparatus according to the present invention comprises a structural defect detection device for detecting a structural defect of a sample and a physical information measurement device for measuring physical information of a defect region including the structural defect detected by the structural defect detection device, and the structural defect setting device provides a function to a computer device that sets the structural defect for which the physical information is to be measured among the structural defects detected by the structural defect detection device based on the defect information of the structural defect.

In addition, the sample analysis apparatus according to the present invention may comprise a first structural defect detection device that detects a structural defect of the sample, a second structural defect detection device that is different from the first structural defect detection device, and a structural defect setting device that sets the structural defect for which the physical information is to be measured by the second structural defect detection device from among the structural defects detected by the first structural defect detection device based on the defect information of the structural defect, also wherein the second structural defect detection device may measure the defect region including the structural defect that is set by the structural defect setting device. With this configuration, if the measurement speed of the first structural defect detection device is faster than that of the second structural defect detection device, the first structural defect detection device with the faster measurement speed measures the whole sample and the second structural defect detection device with the slower measurement speed measures locally only the defect region including the structural defect so that the time of sample analysis can be shortened.

Moreover, the sample analysis apparatus according to the present invention may comprise a first structural defect detection device that detects the structural defect of the sample and a second structural defect detection device that measures an region other than the defect region including the structural defect detected by the first structural defect detection device. With this configuration, if the measurement speed of the first structural defect detection device is faster than that of the second structural defect detection device, the first structural defect detection device with the faster measurement speed measures the whole sample and the second structural defect detection device with the slower measurement speed measures locally an region other than the defect region including the structural defect so that the time of sample analysis can be shortened.

Effects of the Invention

According to the present invention with this configuration, by not only detecting the structural defect that exists in the sample but also by measuring the physical information that occurs due to the structural defect, the sample can be analyzed efficiently with combining structural defect detection and measurement of physical information to thereby enable a determination of whether the structural defect is the defect that degrades the device performance or not, and the like.

DETAILED DESCRIPTION OF THE EMBODIMENTS

A sample analysis apparatus according to the present invention is described below with reference to the drawings.

Figure 1:
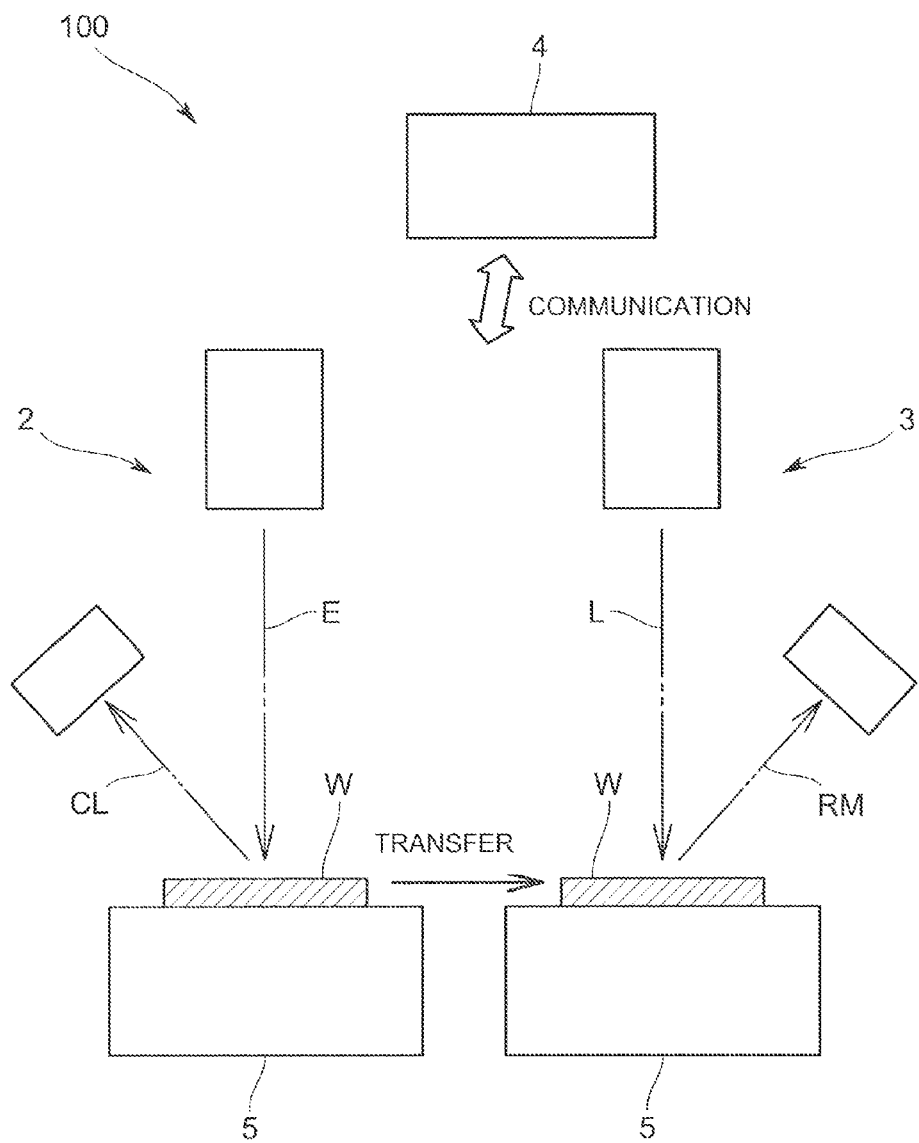
FIG. 1 is an illustration schematically showing a configuration of a sample analysis apparatus according to the present embodiment.
Figure 2:
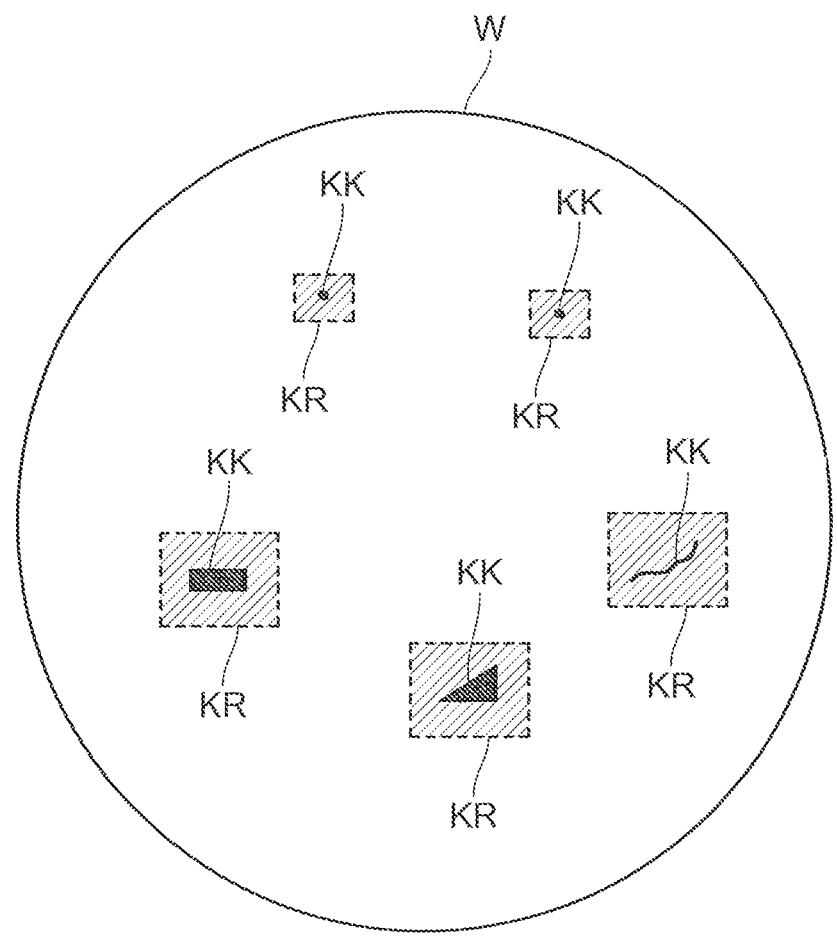
FIG. 2 is a schematic diagram showing stress measurement regions (defect regions) according to the same embodiment.

A sample analysis apparatus 100 according to the present embodiment, as shown in FIG. 1 and FIG. 2, comprises a structural defect detection device 2 that detects a structural defect KK of a semiconductor wafer W (hereafter sample W), for example, such as a SiC wafer, etc., used for a semiconductor device, a physical information measurement device 3 that measures physical information obtained from the sample W, an information processing device 4 that acquires defect detection result data from the structural defect detection device 2 and physical information data from the physical information measurement device 3, and a staging device 5 that transfers the sample W between the structural defect detection device 2 and the physical information measurement device 3.

The structural defect detection device 2 detects nondestructively the structural defect KK, such as a crystal defect included in a crystal of the sample W, and is a so-called cathode luminescence measurement apparatus that detects the structural defect KK by using a cathode luminescence CL generated by irradiating with an electron beam E substantially the entire surface or a prescribed region of the sample W. In cathode luminescence, the electron beam E that impinges upon the surface or a prescribed region of the sample, induces the sample to emit light. The emitted light is collected by an optical system such as a mirror, and transferred via fiber optic or other means to a monochromator which separates the emitted light into its component wavelengths. Light for each of the component wavelengths is passed through a photomultiplier tube for detection. By scanning the entire surface or prescribed region of the sample in a pattern, such as an X-Y pattern, a map of the optical activity of the sample can be generated. Here, the structural defect KK that the structural defect detection device 2 detects is specifically a point defect, a line defect, or a plane defect, etc., included in the crystal of the sample W.

The cathode luminescence measurement apparatus of the present embodiment does not analyze the full spectrum of light emitted at every component wavelength from the sample W upon irradiation by electron beam E, rather it converts a light intensity over the entire wavelength region in the light emitted from sample W, or a light intensity of a prescribed wavelength region, into a light intensity signal (an output signal having a current value (or a voltage value)) using a light detector such as a photomultiplier tube, etc., and using the light intensity signal it generates an image showing the light intensity at each position of the surface of the sample W, and based on this it detects a point defect, a line defect, and a plane defect, etc., included in the crystal of the sample W region. Here, when sample W is a SiC wafer, since many crystal defects exist, peaks resulting from the crystal defects exist in a plurality of the wavelengths, and the spectrum that is emitted is broad. As a result, when detecting a point defect, line defect, or plane defect, etc., included in the crystal of the SiC wafer by using the spectrum data, the detection accuracy becomes low. For this reason, when the sample W is a SiC wafer, it is desirable to detect the structural defect KK of the sample W using the light intensity of the light generated from the sample W.

Moreover, the structural defect detection device 2, may alternatively be a photoluminescence measurement apparatus that detects the structural defect KK by using photoluminescence obtained by irradiating with light on the sample W, an electroluminescent measurement apparatus that detects the structural defect KK using electroluminescence obtained by applying a voltage to the sample W, or a laser scattered light measurement apparatus that detects the structural defect KK using a laser scattered light obtained by irradiating the sample with a laser beam.

The physical information measurement device 3 measures physical information such as a film thickness, a refractive index, a stress or a composition of the sample W. This physical information measurement device 3 is a stress measurement device 3 in this embodiment, which measures nondestructively the stress of the prescribed regions of the sample W, and a so-called Raman spectroscopic measurement apparatus that makes a spectral analysis of the Raman scattered light RM that is a second light generated by irradiating the sample W with a laser beam L, which is an excitation energy line, and measures the stress of the sample W from the Raman spectrum obtained as a result of the analysis.

This stress measurement device 3, as shown in FIG. 2, is configured so that it measures the stress of the defect region KR including the structural defect KK detected by the structural defect detection device 2. Specifically, the stress measurement device 3 is configured so that it measures the stress inside the defect region KR set around so as to encompass the structural defect KK. That is, the defect region KR becomes the stress measurement region. This defect region KR is the region having a slightly bigger region than the structural defect KK. Moreover, regarding the defect region KR, a method of setting up may be different according to the kind of structural defect KK, size of the structural defect KK, shape of the structural defect KK, or position of the structural defect KK on the sample W, and the like. For example, the manner of setting the defect region KR including a plane defect may include a region separated from the defect within the defect region KR to a greater extent than, for example, a manner of setting the defect region KR including a point defect. That is, a region separated from the defect may be included in the defect region KR to an extent that decreases with the type of defect as follows: plane defect, line defect, and point defect. In addition, in FIG. 2, although the defect region KR is rectangular shape, it is not so limited. More particularly, the region encompassed within an outline that is a prescribed distance from the structural defect KK may be defined as the defect region KR, and the outline shape of the defect region KR and the outline shape of the structural defect KK may have substantially the same shape. With this configuration, the separation distance from the defect to the outline will be large, medium, and small, in that order for each of the plane defect, line defect, and point defect.

As aspects of the stress measurement device 3 measuring the stress of the defect region KR, the following (1) and (2) can be considered.

(1) The stress measurement device 3 has a defect region calculation device that acquires defect detection result data from the structural defect detection device 2 and calculates the defect region data from the structural defect data included in the defect detection result data.

The stress measurement device 3 here comprises a structural defect setting device that sets the structural defect KK for which the stress is to be measured among the structural defects KK detected by the structural defect detection device 2 based on the defect information of the structural defect KK. The structural defect setting device sets the structural defect KK that measures the stress in the structural defect KK obtained by the structural defect detection device 2 according to the defect information of the structural defect KK, specifically, the kind of the structural defect KK (a point defect, a line defect (for example, straight line or curved line), a plane defect (for example, in the case of SiC, a right angled triangle or a rectangular shape), etc.), the size of the structural defect KK, the shape of the structural defect KK, or the position of the structural defect KK of the sample W and the like. Then, the defect region calculation device of the stress measurement device 3 calculates the defect region data from the structural defect data of the structural defect KK that is set up by the structural defect setting device.

In addition, the structural defect setting device may set up the structural defect KK according to the setting conditions based on the defect information inputted beforehand, and it may receive a structural defect designating signal that a user specified as the structural defect KK for which the stress is to be measured based on the defect information, and set the structural defect KK according to the setting conditions indicated by the structural defect designating signal.

The stress measurement device 3 irradiates while scanning the laser light L on the defect region KR indicated by the defect region data, makes the spectral analysis the Raman scattered light RM emitted as a result of the irradiation, and measures the stress of the sample W from the Raman spectrum obtained as a result of the analysis. At this time, since the structural defect detection device 2 and the stress measurement device 3 each have a dedicated control device, respectively they can be considered to execute transmission and reception, etc., of the defect detection data. In addition, it may be configured so that the defect detection result data may be exchanged through an external memory, such as USB, etc. Moreover, the structural defect setting device and the defect region calculation device are configured by the dedicated control device of the stress measurement device 3. The dedicated control device, for example, is a special purpose or general purpose computer, which has a CPU, memory, and input output interface, as well as an input device such as a keyboard, etc., and an output device such as a display, etc.

(2) The stress measurement device 3, via the information processing device 4, acquires the defect region data calculated from the structural defect data obtained by the structural defect detection device 2.

In addition, the information processing device 4 acquires the defect detection result data from the structural defect detection device 2, has the defect region calculation device that calculates the defect region data from the structural defect data included in the defect detection result data, and sends the defect region data calculated by the defect region calculation device to the stress measurement device 3.

This information processing device 4 comprises the structural defect setting device that sets up the structural defect KK for which the stress is to be measured among the structural defect KK detected by the structural defect detection device 2 based on the defect information of the structural defect KK. The structural defect setting device sets up the structural defect KK that measures the stress in the structural defect KK obtained by the structural defect detection device 2 according to the defect information of the structural defect KK, specifically, a kind of the structural defect KK (a point defect, a line defect (for example, a straight line or a curved line), a plane defect (for example, in the case of SiC, a right angled triangle or a rectangular shape), etc.), a size of the structural defect KK, a shape of the structural defect KK, or a position of the structural defect KK of the sample W and the like. Then, the defect region calculation device of the information processing device 4 calculates the defect region data from the structural defect data of the structural defect KK that is set up by the structural defect setting device.

The stress measurement device 3 irradiates with the laser light L on the defect region KR showed by the defect region data, carries out the spectral analysis to the Raman scattered light RM generated as a result of the irradiation, and measures the stress of the sample W from the Raman spectrum obtained as a result of the analysis. At this time, it can be considered that the information processing device 4 functions as a central control unit of the structural defect detection device 2 and the stress measurement device 3. Moreover, the structural defect setting device and the defect region calculation device are configured by the information processing device 4. The information processing device 4, for example, is a special purpose or general purpose computer, which has a CPU, memory, input output interface, and an input device such as a keyboard, etc., and an output device such as a display, etc.

Furthermore, irradiation with the electron beam E on the sample W in the structural defect detection process of the structural defect detection device 2 and irradiation with the laser beam L on the sample W in the stress measurement process of the stress measurement device 3 are executed by the staging device 5 by moving the sample W to the XY direction. Additionally, in a stress measurement process, the sample W is moved so that the stress measurement device 3 outputs the defect region data to the staging device 5 and the staging device 5 irradiates with the laser beam L on the defect region KR. Moreover, it may be possible that the laser beam L is irradiated on the defect region KR by controlling the staging device 5 by the information processing device 4.

In addition, in this embodiment, since the structural defect detection process and the stress measurement process are executed in the different positions, the staging device 5 moves the sample W to the position after finishing the structural defect process, where the stress measurement process is executed. Moreover, when the staging device 5 is arranged separately to the structural defect detection device 2 and the stress measurement device respectively, the sample W having completed the structural defect process may be moved by a transfer device or a user.

Furthermore, the information processing device 4 acquires the stress measurement result data that is the physical information data from the stress measurement device 3, and produces output so as to enable one to determine the good or bad quality of the structural defect KK using the stress measurement result. Here, the good or bad quality of the structural defect KK is determined based on whether it is a structural defect or not, which degrades the performance of the article of manufacture (for example, a semiconductor device) obtained by processing the sample (for example, a semiconductor wafer). In addition, as an apparatus configuration, for example, it is a special purpose or general purpose computer having a CPU, memory, and input output interface, and an input device such as a keyboard, etc., and an output device such as display, etc. This information processing device 4 performs the following processes by installing a sample analysis program in a prescribed region of memory.

Specifically, this information processing device 4 compares a stress that is indicated by the stress data included in the stress measurement result data acquired by the stress measurement device 3 or a stress related value that is indicated by a stress related value data related to the stress data with a prescribed threshold value stored in the memory beforehand. In addition, the prescribed threshold value may be a threshold value for stress when comparing with stress, and may be a threshold stress related value when comparing a stress related value. Moreover, the information processing device 4 discriminates structural defect KK obtained by the structural defect detection device 2 by comparison of the stress or the stress related value and the prescribed threshold value. That is, it discriminates between two kinds of the defects: a "bad defect" by which the device performance of the semiconductor device would be degraded or the degradation would be out of the acceptable range when the structural defect KK is larger than the prescribed threshold value, and a "good defect" by which the device performance of the semiconductor device would not be degraded or the degradation would be in the acceptable range when the structural defect KK is smaller than the prescribed threshold value. The information processing device 4 indicates the result discriminated in this way on the display and enables a user viewing the result to determine the good or bad quality of the structural defect KK.

In addition, regarding the prescribed threshold value, since the stress differs, in order to determine it as a poor defect depending on the defect information of the structural defect, the threshold value may be set differ according to the kind of the structural defect KK (a point defect, a line defect (for example, straight line or curved line), a plane defect (for example, in the case of SiC, a right angled triangle or a rectangular shape), etc.), the size of the structural defect KK, the shape of the structural defect KK, or the position of the structural defect KK of the sample W and the like. Moreover, these threshold values may be stored in a memory that the user sets beforehand, or may be setup using the input device by a user who looked at the detection result of the structural defect detection device 2 on the display, etc.

In this configuration of the sample analysis apparatus 100 according to this embodiment, not only does the structural defect detection device 2 detect the structural defect KK, but also the structural defect KK for which the stress is to be measured is set based on the defect information by the structural defect setting device and the stress measurement device 3 measures the stress of the defect region KR including the set up structural defect KK, and therefore it is possible to determine whether the defect degrades the performance of the article of manufacture or not, which is difficult to be determined only from detecting the structural defect KK by the structural defect detection device 2. For example, it is possible to determine that the structural defect KK with a large stress concentration is a defect ("bad defect") that degrades the performance of the article of manufacture and the structural defect KK with a small stress concentration is not a defect ("good defect") that degrades the performance of the article of manufacture. Thereby, it is effective to improve the yield rate of the article of manufacture. Moreover, since the stress measurement by the stress measurement device 3 is executed locally on the defect region KR including the structural defect KK, the time of sample analysis can be shortened.

Furthermore, since the information processing device 4 outputs so as to enable a user to determine the good or bad quality of the structural defect KK using the stress measurement result, it is possible to determine whether the defect degrades the performance of the article of manufacture or not, which is difficult to be determined only from detecting the structural defect KK by the structural defect detection device 2.

In addition, the present invention is not limited to the above described embodiment.

For example, the information processing device may be enable the user to determine the good or bad quality of the structural defect by displaying in parallel a defect display screen that displays an image data included in the defect detection result data and a stress display screen that displays an image data included the stress measurement result data on the display simultaneously. Moreover, the defect display screen and stress display screen may be switched to the display on the display. Furthermore, only the stress display screen may be displayed on the display Moreover, although it was indicated in the above mentioned (1) that the stress measurement device includes the structural defect setting device and the defect region calculation device, and in the above mentioned (2) that the information processing apparatus includes the structural defect setting device and the defect region calculation device, it will be appreciated that the structural defect detection device may have the structural defect setting device and the defect region calculation device. In addition, the structural defect setting device and the stress measurement device may be configured as separate components, respectively. Moreover, the structural defect setting device and the stress measurement device may be configured with other control apparatuses.

Figure 3:
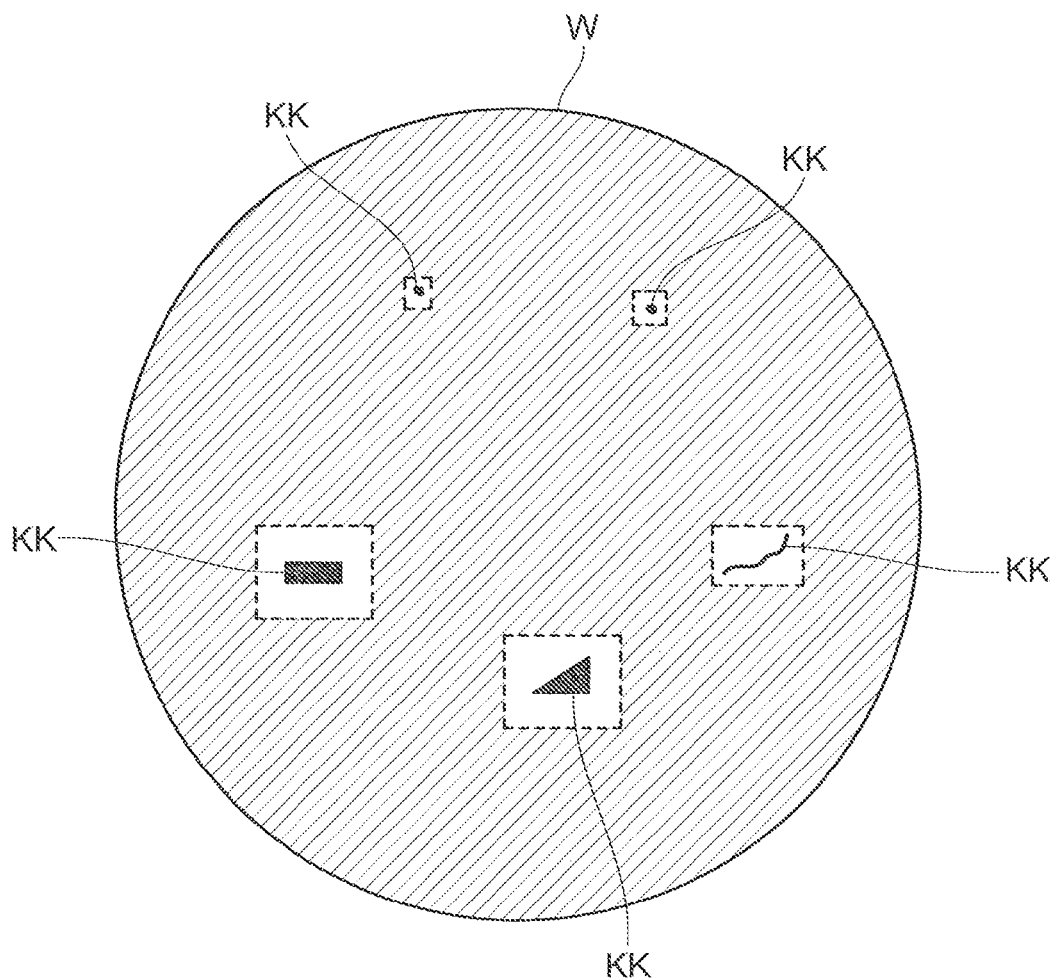
FIG. 3 is a schematic diagram showing stress measurement regions (defect regions) according to a modified embodiment.

In addition, the stress measurement device 3, as shown in FIG. 3, may be configured so as to measure the stress of a region other than the defect region KR including the structural defect KK detected by the structural defect detection device 2. With this configuration, since the structural defect detection device 2 not only detects the structural defect KK, but also the stress measurement device 3 measures the stress of the region other than the defect region KR including the structural defect KK, the structural defect KK or other defects that are not detected by the structural defect detection device 2 can be determined by the stress measurement result obtained from the stress measurement device 3. For example, if no structural defect KK is apparent but a stress concentration occurs for some reason, it can be determined that the performance of the article of manufacture would be degraded by the stress concentration. In this manner, the yield rate of the article of manufacture may be effectively improved. Moreover, since stress measurement of a region other than the defect region KR including the structural defect KK detected by the structural defect detection device 2 is executed, it is not necessary to make the stress measurement of the whole sample and the time of sample analysis can be shortened.

In this case, similar to the above described embodiment, the structural defect KK that is excluded from the stress measurement by the structural defect setting device may be set based on the defect information, and a region other than the defect region KR including the structural defect KK, which is set by the structural defect setting device may be have stress measurement performed upon it by the stress measurement device 3.

As the physical information measurement device 3, in addition, it may be a measurement apparatus that carries out the spectral analysis by irradiating infrared radiation the sample W and uses an infrared spectroscopy that measures the physical information of the sample W from an infrared absorption spectrum obtained as a result, and also it may be a measurement apparatus that carries out the spectral analysis by irradiating ultraviolet radiation on the sample W and uses an ultraviolet-visible spectroscopy that measures the physical information of the sample W from an ultraviolet-visible absorption spectrum obtained as the result.

Moreover, the sample analysis apparatus 100 may comprise several different structural defect detection devices 2. For example, the sample analysis apparatus 100 may comprise a first structural defect detection device 21 and a second structural defect detection device 22 that is different from the first structural defect detection device 21. Here, the first structural defect detection device 21 or the second structural defect detection device 22 may be considered to be a photo luminescence measurement device, an electro luminescent measurement device, a cathode luminescence measurement device or a laser scattered light measurement device, etc. Specifically, when the second structural defect detection device 22 is set to be the cathode luminescence measurement device 22, the laser scattered light measurement device 21 with faster measurement speed than the cathode luminescence measurement device 22 may be set to be the first structural defect detection device 21.

Specifically, the sample analysis apparatus 100 may comprise a laser scattered light measurement device 21 as the first structural defect detection device, the cathode luminescence measurement device 22 as the second structural defect detection device, and the information processing device 4 having the structural defect setting device that sets the structural defect KK that is to be measured by the cathode luminescence measurement device 22 among the structural defects KK detected by the laser scattered light measurement device 21 based on the defect information of the structural defect KK, and the cathode luminescence measurement device 22 may measure the defect region KR including the structural defect KK set by the structural defect setting device. With this configuration, the laser scattered light measurement device 21 with faster measurement speed measures the whole sample and the cathode luminescence measurement device 22 with the slower measurement speed measures locally only the defect region KR including the structural defect KK so that the time of sample analysis can be shortened.

Moreover, the sample analysis apparatus 100 may comprise the laser scattered light measurement device 21 as the first structural defect detection device, the cathode luminescence measurement device 22 as the second structural defect detection device, and the information processing device 4 having the structural defect setting device that sets the structural defect KK for which the physical information is to be measured among the structural defects KK detected by the laser scattered light measurement device 21 based on the defect information of the structural defect KK, the laser scattered light measurement device 21 may set the defect region KR including the detected structural defect KK, and the cathode luminescence measurement device 22 may detect the structural defect KK of the sample in the region other than defect region KR. With this configuration, the cathode luminescence measurement device 22 measures only the region where the structural defect KK is not detected by the laser scattered light measurement device 21 so that the time of sample analysis can be shortened. In addition, since the region other than the defect region KR is measured by the laser scattered light measurement device 21 having the different measurement principle and the cathode luminescence measurement device 22, structural defects KK that could not be detected by the laser scattered light measurement device 21 can be measured by the cathode luminescence measurement device 22, and the detection accuracy of the structural defect KK in sample W can be improved further.

Additionally, the sample analysis apparatus 100 may comprises a laser scattered light measurement device 21 as the first structural defect detection device, the cathode luminescence measurement device 22 as the second structural defect detection device, the stress measurement device 3, and information processing device 4 having the structural defect setting device that sets the structural defect KK for which the physical information is to be measured among the structural defects KK detected by the laser scattered light measurement device 21 or the cathode luminescence measurement device 22 based on the defect information of the structural defect KK, and the stress measurement device 3 may measure the physical information of the defect region KR including the structural defect KK set up by the structural defect setting device. Here, the defect region KR may include only a structural defect KK detected by the laser scattered light measurement device 21, it may include only a structural defect KK detected by the cathode luminescence measurement device 22, or it may include a structural defect KK detected by the laser scattered light measurement device 21 and the cathode luminescence measurement device 22. With this configuration, since it is possible to choose the optimal structural defect detection device 2 among a plurality of different structural defect detection device 2 according to the characteristic of the physical property, etc., of the sample W or the criteria of determination of the good or bad quality of the structural defect KK, the physical information can be measured efficiently and the sample W can be analyzed efficiently while improving the detection accuracy of the structural defect KK.

In addition, the present invention is not limited to the above mentioned embodiments, and it should be understood that various modifications may be possible without departing from the spirit and scope of the present invention.

EXPLANATION OF REFERENCE CHARACTERS

100 . . . Sample analysis apparatus
W . . . Sample
KK . . . Structural defect
KR . . . Defect region
2 . . . Structural defect detection device
3 . . . Stress measurement device
4 . . . Information processing device

I claim:

1. A sample analysis apparatus comprising:
a structural defect detection device that detects a structural defect of a sample,
a structural defect setting device that sets the structural defect for which physical information is to be measured among structural defects detected by the structural defect detection device based on defect information of the structural defect,
a control device configured to control a first physical information measurement device and a second physical information measurement device, such that:
the first physical information measurement device measures physical information of a first defect region including the structural defect set by the structural defect setting device based on the defect information of the structural defect, and
the second physical information measurement device measures physical information of a second region other than the first defect region including the structural defect detected by the structural defect detection device, after the first physical information measurement device has measured the physical information of the first defect region.

2. The sample analysis apparatus according to claim 1, wherein the structural defect setting device sets a structural defect for which physical information is to be measured according to a kind or a size of the structural defect.

3. The sample analysis apparatus according to claim 1, wherein the structural defect setting device receives a structural defect designating signal that a user designated as a structural defect for which physical information is to be measured based on defect information of the structural defect and then sets a structural defect for which physical information is to be measured according to the structural defect designating signal.

4. A sample analysis apparatus comprising:
a structural defect detection device that detects a structural defect of a sample,
a control device configured to control a first physical information measurement device and a second physical information measurement device, such that:
the first physical information measurement device measures physical information of a first defect region including the structural defect set by the structural defect setting device based on defect information of the structural defect,
the second physical information measurement device measures physical information of a second region other than the first defect region including the structural defect detected by the structural defect detection device, after the first physical information measurement device has measured the physical information of the first defect region.

5. A non-transitory computer readable medium storing a sample analysis program executed on a computing device that is configured to control a sample analysis apparatus comprising a structural defect detection device that detects a structural defect of a sample, a control device configured to control a first physical information measurement device and a second physical information measurement device, the first physical information measurement device measuring physical information of a first defect region including the structural defect detected by the structural defect detection device, and the second physical information measurement device measuring physical information of a second region other than the first defect region including the structural defect detected by the structural defect detection device, after the first physical information measurement device has measured the physical information of the first defect region, wherein the sample analysis program makes the computing device function as a structural defect setting device that sets a structural defect based on structural information of the structural defect for which the physical information is to be measured among the structural defects detected by the structural defect detection device.

6. The sample analysis apparatus of claim 4, wherein the structural defect detection device is a first structural defect detection device, the sample analysis apparatus further comprising:
a second structural defect detection device.

7. The sample analysis apparatus of claim 6, wherein:
the first structural defect detection device is a scattered light measurement device; and
the second structural defect detection device is a cathode luminescence measurement device.

8. The sample analysis apparatus of claim 1, further comprising:
a staging device that transfers the sample from the first physical information measurement device to the second physical information measurement device after the first physical information measurement device has measured the physical information of the first defect region.

9. A method for analyzing a sample, comprising:
detecting a structural defect of the sample in a first defect region using a structural defect detection device,
measuring physical information of the first defect region including the structural defect set by a structural defect setting device that is configured to set the structural defect based on defect information of the structural defect for which physical information is to be measured, and
after measuring the physical information of the first defect region, measuring physical information of a second region other than the first defect region including the structural defect detected by the structural defect detection device.

10. The method according to claim 9, where the structural defect setting device sets a structural defect for which physical information is to be measured according to a kind or a size of the structural defect.

11. The method according to claim 9, where the structural defect for which physical information is to be measured is designated by a user, the structural defect setting device receiving a structural defect designating signal, and setting the structural defect for which physical information is to be measured based on defect information of the structural defect according to the structural defect designating signal.

* * * * *